US006236290B1

(12) United States Patent
Abe et al.

(10) Patent No.: US 6,236,290 B1
(45) Date of Patent: May 22, 2001

(54) MULTILAYER FILTER

(75) Inventors: Toshiyuki Abe; Norimasa Ishitobi, both of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/330,057

(22) Filed: Jun. 11, 1999

(30) Foreign Application Priority Data

Sep. 4, 1998 (JP) ........................................ 10-251393

(51) Int. Cl.[7] .................................... H03H 7/01
(52) U.S. Cl. ..................... 333/185; 333/206; 333/204
(58) Field of Search ............................ 333/185, 204, 333/219, 206

(56) References Cited

U.S. PATENT DOCUMENTS 5,777,533 * 7/1998 Kato et al. ........................ 333/185
5,783,978 * 7/1998 Noguchi et al. .................. 333/202
6,061,227 * 6/2000 Nogi .................................. 361/303

FOREIGN PATENT DOCUMENTS

2303495 * 2/1997 (GB) .
9-35936 2/1997 (JP) .

* cited by examiner

*Primary Examiner*—Benny Lee
*Assistant Examiner*—Stephen E. Jones
(74) *Attorney, Agent, or Firm*—Oblon, Spivak, McClelland, Maier & Neustadt, P.C.

(57) ABSTRACT

Input-output terminal electrodes 3 and 4 are overlaid in both respective edge faces of the multilayer body 1 of a multilayer filter. Ground electrodes 5 and 5 are overlaid on both respective sides of the multilayer body 1. Through-hole electrodes 16 and 17 for use as a pair of inductance elements are formed in the multilayer body. One ends of the inductance elements are each electrically coupled to the input-output terminal electrodes 3 and 4, the other ends being connected to the conductive layer formed as a sealed electrode 21. Paralleled capacitors connected to the inductance elements are formed in the multilayer body 1. The ratio W/d of the diameter d of the through-hole electrodes 16 and 17 to width W between the ground electrodes 5 and 5 on both edge faces of the multilayer body 1 is set at not less than 1.6 and not greater than 11.4.

4 Claims, 5 Drawing Sheets

MULTILAYER FILTER

BACKGROUND OF THE INVENTION

This invention relates to a multilayer filter having characteristics of a band pass filter for use in mobile communication equipment such as a portable cellular telephone and the like.

A typical conventional multilayer filter comprises a plurality of strip-line resonators in the form of a multilayer body which is generally formed from dielectric and conductive layers which are stacked up by a sheeting or screen printing method before being sintered. In order to reduce the size of the multilayer filter using the strip-line resonators, the resonance frequency is lowered by providing capacitors connected in parallel in the multilayer body to obtain target filter characteristics.

In such a multilayer filter as formed with the strip-line resonators, however, current is concentrated on the edge portion of the strip-line conductive layer and the Q-factor is degraded, which poses a problem in that good filter characteristics are unobtainable.

It has been proposed by JP-A 9-35936 to use through-hole electrodes as inductance elements for solving the foregoing problems.

The multilayer filter disclosed in the aforesaid Japanese Patent Publication is seemingly intended to set the ratio W/d of the diameter d of a through-hole to the width W of a multilayer body is set at about 13. With an arrangement like this, however, the Q-factor would never be improved because the resistance value grows larger, though a large inductance value can be secured.

SUMMARY OF THE INVENTION

An object of the present invention is to provide a multilayer filter using through-holes as inductance elements, in which the multilayer filter is small in size and capable of improving the Q-value further.

According to the present invention, a multilayer filter comprises a multilayer body formed by stacking and sintering dielectric and conductive layers; input-output terminal electrodes overlaid in both respective edge faces of the multilayer body; ground electrodes overlaid on both respective sides of the multilayer body; inductance elements in a form of a plurality of through-hole electrodes formed in the multilayer body; paralleled capacitors connected to the inductance elements formed in the multilayer body; and in that one end of each inductance element is electrically coupled to the input-output terminal electrode, the other end is connected to the conductive layer as a sealed electrode; and the ratio W/d of the diameter d of the through-hole electrode to width W between the ground electrodes on both edge faces of the multilayer body is set at not less than 1.6 and not greater than 11.4.

The multilayer filter according to the present invention is thus of quasi-coaxial type, that is, provided with the sealed electrodes in both respective sides of a body of generally cubic shape, and the through-hole electrodes as inductance elements. Moreover, not lower than about 70% of the maximum value is made obtainable as the Q-factor by setting the ratio of the diameter d of the through-hole to the width W of the multilayer body at the range of 1.6 to 11.4.

Further, in a multilayer filter, an impedance-matching capacitor is provided between the input-output terminal electrode and the inductance element.

DETAILED DESCRIPTION OF THE PREFERRED EMBODIMENTS

Figure 1A:
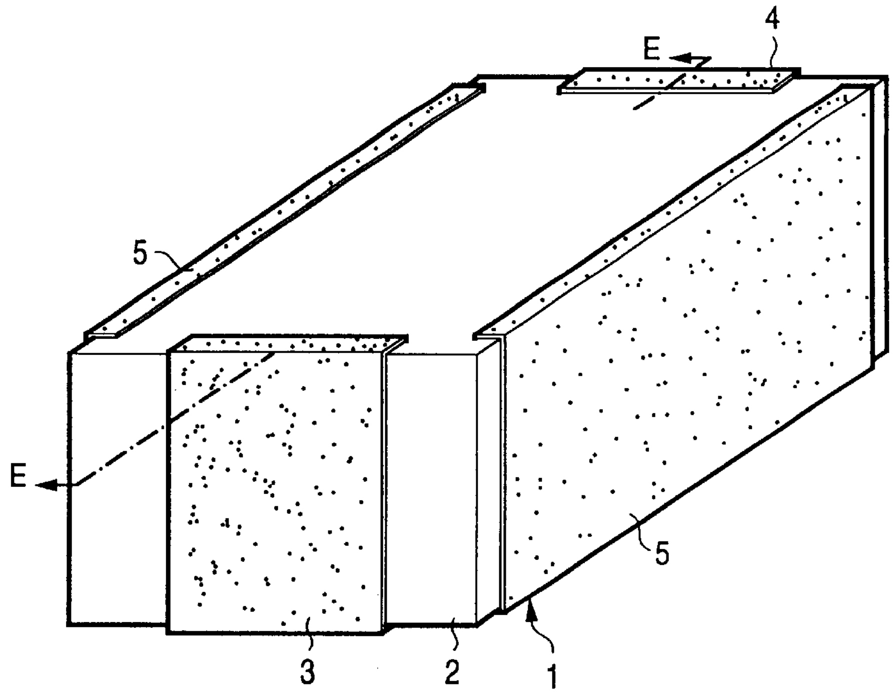
FIG. 1A is a perspective view of a multilayer filter embodying the present invention.
Figure 1B:
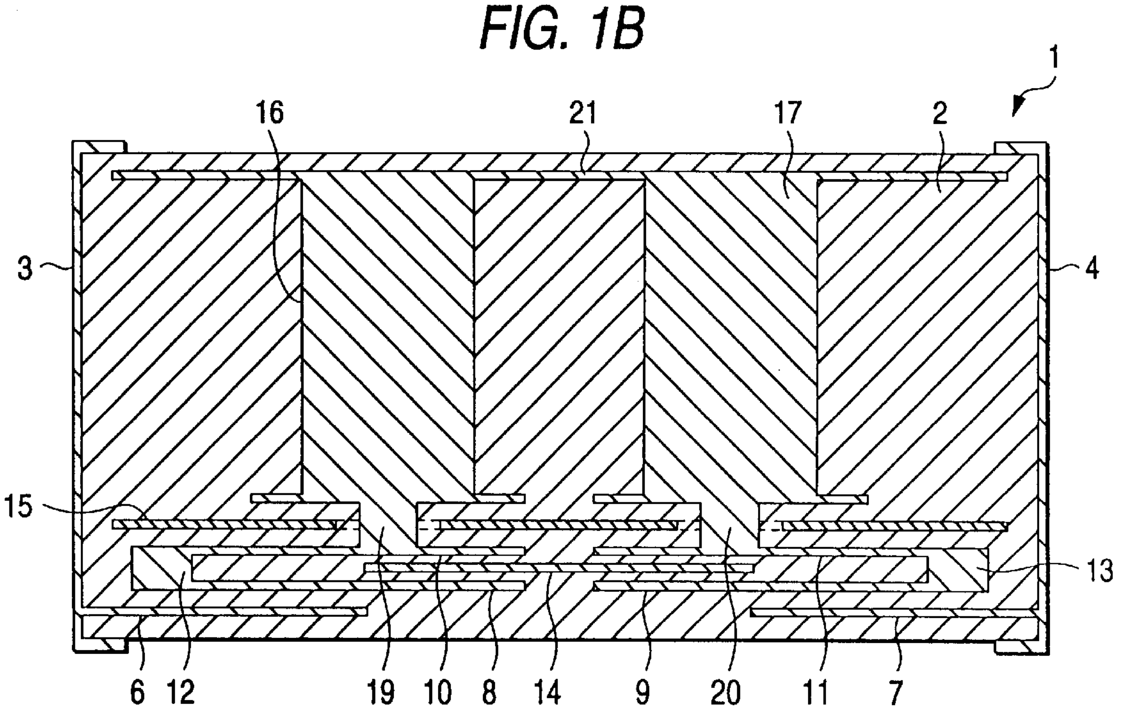
FIG. 1B is a sectional view taken on line E—E of FIG. 1A.
Figure 2:
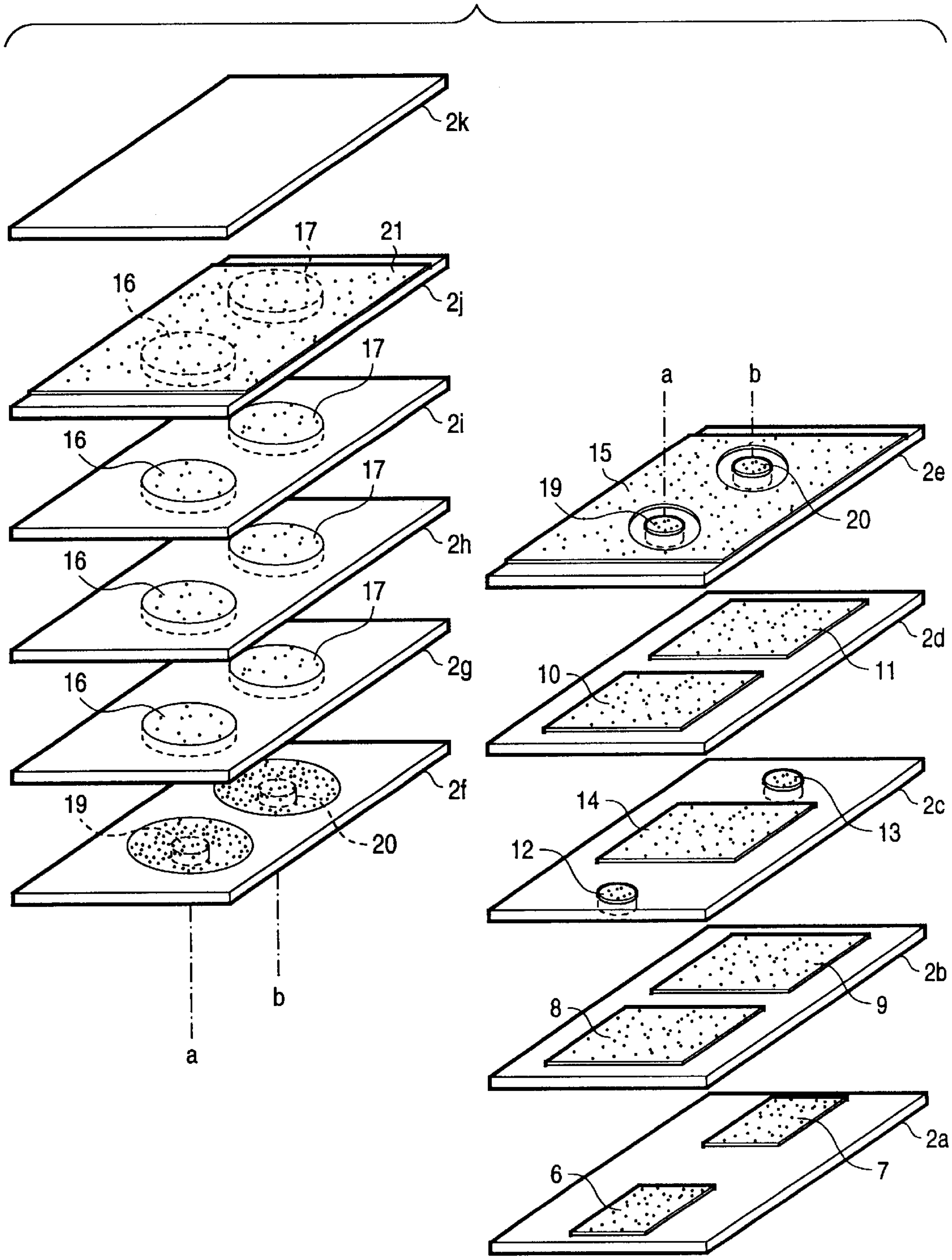
FIG. 2 is a layer structural diagram of the multilayer filter of FIGS. 1A and 1B.
Figure 3A:
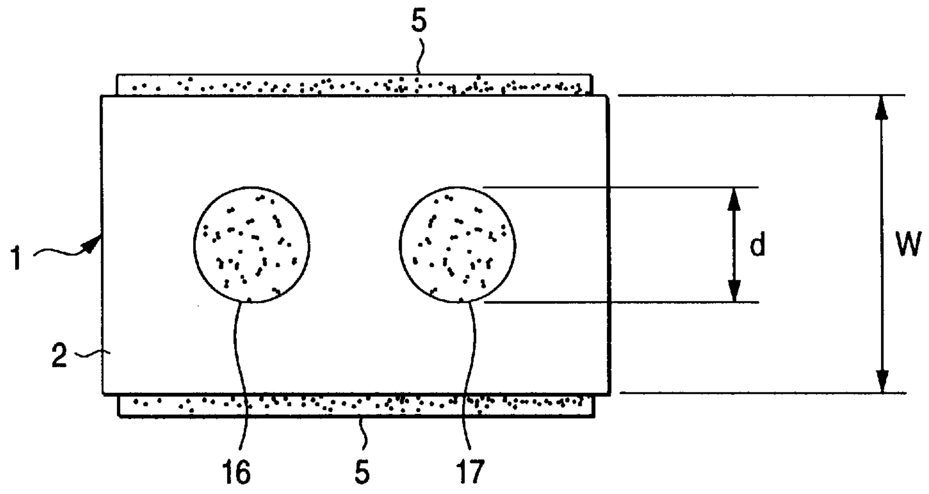
FIG. 3A is a diagram illustrating the diameter d of a through-hole and width W between both sides of a multilayer body.

FIG. 1A is a perspective view of a multilayer filter embodying the present invention; FIG. 1B, a sectional view taken on line E—E of FIG. 1A; FIG. 2, a layer-to-layer structural diagram; FIG. 3A, a diagram illustrating the diameter d of a through-hole and width W between both sides of a multilayer body 1; and FIG. 3B, an equivalent circuit diagram in the multilayer filter.

In FIGS. 1A and 1B, reference numeral 1 denotes a multilayer body comprising a ceramic dielectric layer 2 and a conductive layer which will be described hereinafter. Input-output terminal electrodes 3 and 4 are overlaid in both respective edge faces of the multilayer body 1, and ground electrodes 5 and 5 are overlaid on both respective sides of the multilayer body 1.

Reference numerals 6 and 7 denote impedance-matching capacitor electrodes each connected to the input-output terminal electrodes 3 and 4 facing capacitor electrodes 8 and 9 via the dielectric layer so as to form impedance-matching capacitors Ci1 and Ci2.

Figure 3B:
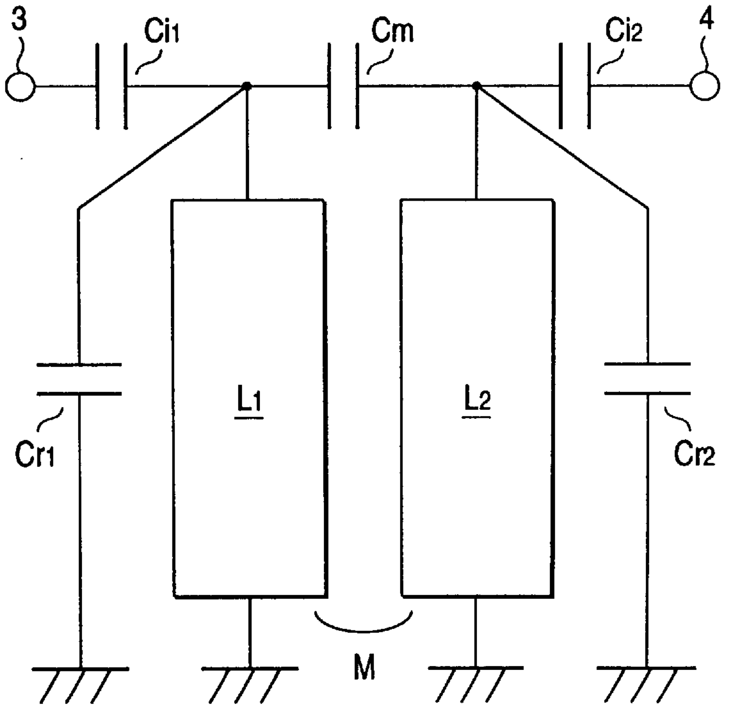
FIG. 3B is an equivalent circuit diagram in the multilayer filter.

Reference numerals 10 and 11 denote capacitor electrodes each connected to the capacitor electrodes 8 and 9 via through-hole electrodes 12 and 13 and by placing a capacitor electrode 14 between the capacitor electrodes 8 and 10 and between the capacitor electrodes 9 and 11 via the dielectric layer, a resonator-to-resonator coupling capacitor Cm of FIG. 3B is formed.

The capacitor electrodes 10 and 11 are placed opposite to a sealed electrode 15 via the dielectric layer whereby to form capacitors Cr1 and Cr2 for resonators each connected to inductance elements L1 and L2 in parallel.

Reference numerals 16 and 17 denote through-hole electrodes for use as the inductance elements L1 and L2 for resonators as shown in FIG. 3B. One ends of the through-hole electrodes 16 and 17 is connected to the capacitor electrodes 10 and 11 via the through-hole electrodes 19 and 20 passing through the sealed electrode 15. Further, the other ends of the through-hole electrodes 16 and 17 are connected to a sealed electrode 21 which is formed as a conductive layer during the laminating process. The sealed electrodes 21 and 15 are each connected to the ground electrodes 5 and 5 on both sides of the multilayer body 1.

FIG. 2 shows a layer structure when the multilayer body 1 is produced by a sheeting method (the multilayer filter according to the present invention may also be produced by a printing method). As shown in FIG. 2, the capacitor electrodes, the sealed electrodes and the through-hole electrodes 6–21 are those formed by printing on the surfaces of green sheets 2*a*–2*k* as ceramic dielectrics or filled in through-holes. The multiple green sheets 2*a*–2*k* provided with the capacitor electrodes, the sealed electrodes and the through-hole electrodes are stacked up, pressure-welded, cut into individual chips and calcined whereby to form the multilayer body 1. Then the input-output terminal electrodes 3 and 4 and the ground electrodes 5 and 5 are fitted to the edge faces and sides of the multilayer body 1 by baking and plating, respectively.

Figure 4:
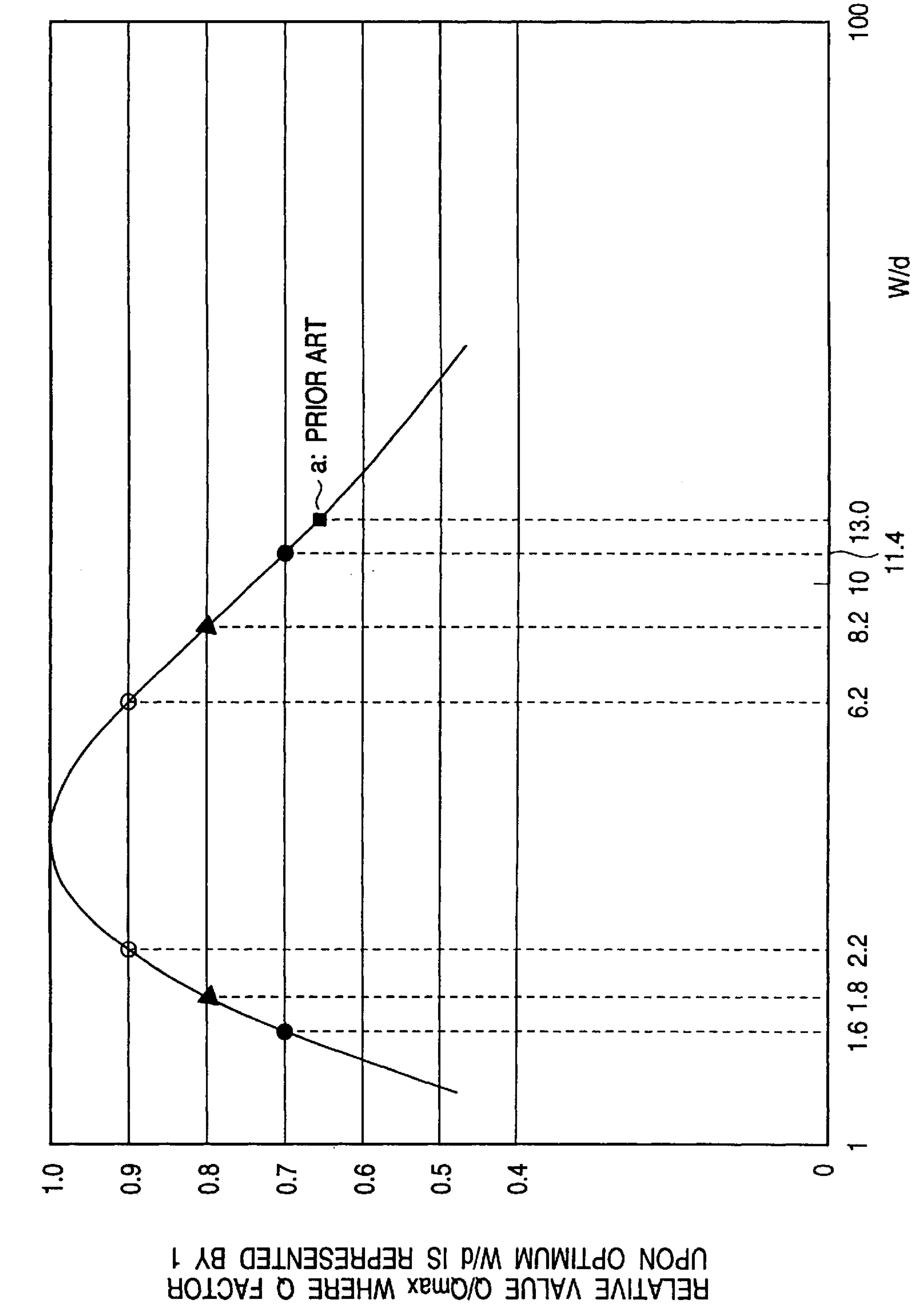
FIG. 4 is a diagram showing the relation between the ratio W/d of the diameter d of the through-hole electrode to side-to-side width W and the Q-factor in the multilayer filter.

FIG. 4 shows the relation between the ratio W/d of the diameter d (see FIG. 3A) of the through-hole electrodes 16 and 17 to side-to-side width W and the Q-factor in the multilayer filter which comprises vertical quasi-coaxial resonators and is formed with the ground electrodes 5 and 5 on the respective sides of the aforementioned multilayer body 1. In the vertical quasi-coaxial structure, the maximum value is established when the above ratio W/d is about 3.4. A point a on the curve of FIG. 4 represents the ratio (≈13) in the multilayer filter described in the aforementioned patent publication, which is about 65% of the maximum value in terms of the Q-factor. In order to secure a Q-factor not lower than 70% of the maximum value, the ratio W/d above is set at not less than 1.6 and not greater than 11.4 and in order to secure a Q-factor not lower than 80% of the maximum value, the ratio W/d above is preferably set at not less than 1.8 and not greater than 8.2 according to the present invention. In order to secure a Q-factor not lower than 90% of the maximum value further, the ratio W/d above is more preferably set at not less than 2.2 and not greater than 6.2 according to the present invention.

Figure 5:
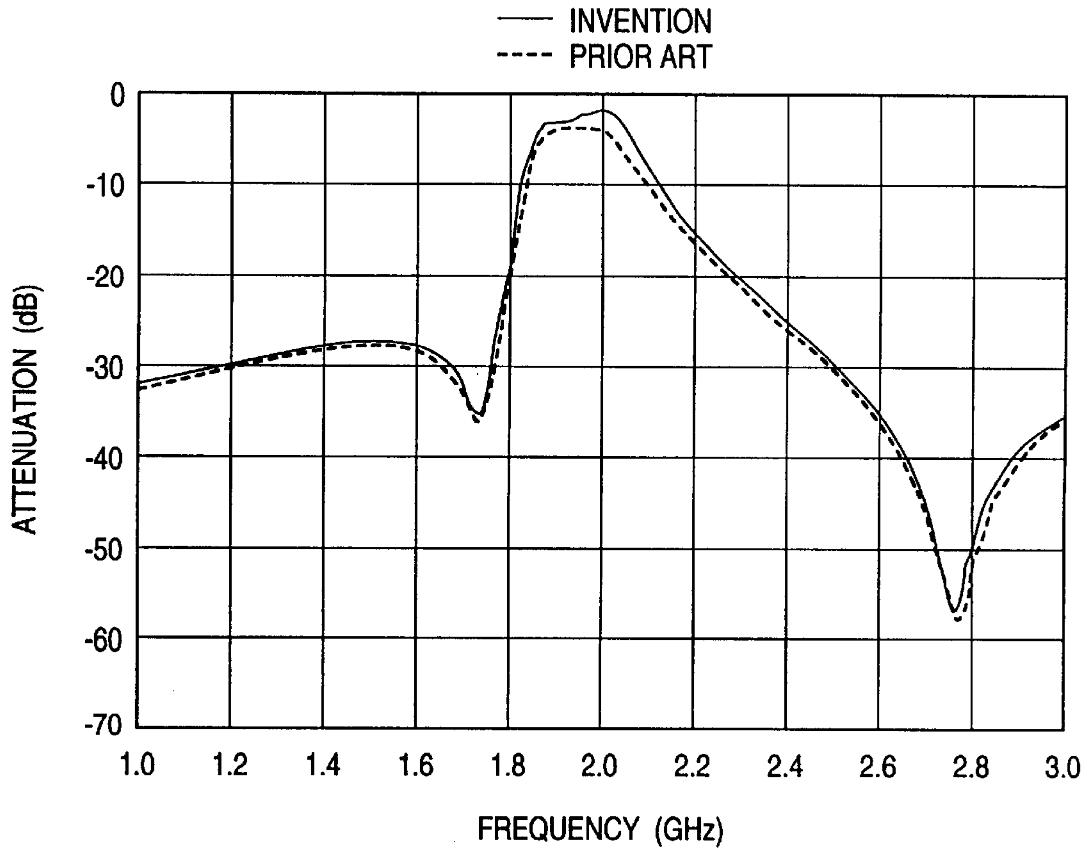
FIG. 5 is a comparative diagram between transmission characteristics when the present invention is applied to a multilayer filter whose central frequency is 1.9 Disc and those of a conventional multilayer filter using strip-line resonators.

FIG. 5 is a comparative diagram between transmission characteristics when the present invention is applied to a multilayer filter whose central frequency is 1.9 GHz and those of the conventional multilayer filter using strip-line resonators. In this case, the ratio W/d is set to 3.4. As shown in FIG. 5, improvement in the Q-factor is seen to be accomplished according to the present invention.

According to the present invention, a small-sized multilayer filter offering a high Q-f actor is made obtainable by employing the through-hole electrodes for forming the inductance elements, setting the ratio W/d of the diameter d of the through-hole to the width W between the ground electrodes on the respective both edge faces of the multilayer body at not less than 1.6 and not greater than 11.4, and providing the built-in capacitors in parallel to the inductance elements.

What is claimed is:

1. A multilayer filter comprising:

a multilayer body formed by stacking and sintering dielectric and conductive layers;

input-output terminal electrodes overlaid on two respective edge faces of the multilayer body;

ground electrodes overlaid on two opposed sides of the multilayer body separated from each other by a distance W;

inductance elements, each inductance element including a respective through-hole electrode of diameter d formed in a corresponding through-hole in said multilayer body;

paralleled capacitors connected to said inductance elements and formed in said multilayer body; and wherein one end of each inductance element is electrically coupled to said input-output terminal electrode, the other end of each inductance element being connected to a conductive layer formed as a sealed electrode in said multilayer body; and a ratio W/d of the diameter d of each through-hole electrode to the distance W separating the ground electrodes being not less than 1.6 and not greater than 11.4.

2. A multilayer filter as claimed in claim 1, wherein at least one impedance-matching capacitor is provided between a respective one of said input-output terminal electrodes and a respective one of said inductance elements.

3. A multilayer filter as claimed in claim 1, wherein the ratio W/d is set at not less than 1.8 and not greater than 8.2.

4. A multilayer filter as claimed in claim 1, wherein the ratio W/d is set at not less than 2.2 and not greater than 6.2.

* * * * *